(12) United States Patent
Bezzam et al.

(10) Patent No.: US 11,551,748 B2
(45) Date of Patent: Jan. 10, 2023

(54) SYSTEM AND METHOD FOR RECYCLING ENERGY OF STATIC RANDOM-ACCESS MEMORY (SRAM) WRITE CIRCUIT

(71) Applicant: Rezonent Microchips Pvt. Ltd., Thrissur (IN)

(72) Inventors: Ignatius Bezzam, Thrissur (IN); Biprangshu Saha, Bangalore (IN); Chirag Gulati, Bangalore (IN)

(73) Assignee: Rezonent Microchips Pvt. Ltd., Thrissur (IN)

( * ) Notice: Subject to any disclaimer, the term of this patent is extended or adjusted under 35 U.S.C. 154(b) by 0 days.

(21) Appl. No.: 17/307,943

(22) Filed: May 4, 2021

(65) Prior Publication Data
US 2021/0350848 A1 Nov. 11, 2021

(30) Foreign Application Priority Data

May 5, 2020 (IN) .............................. 202041019165

(51) Int. Cl.
*G11C 11/419* (2006.01)
(52) U.S. Cl.
CPC .................................. *G11C 11/419* (2013.01)

(58) Field of Classification Search
CPC ...... G11C 11/417; G11C 11/419; G11C 11/41; G11C 11/48; G11C 17/02; G11C 17/14; G11C 5/142

(Continued)

(56) References Cited

U.S. PATENT DOCUMENTS 11,108,572 B2 * 8/2021 Lu .......................... G11C 11/419
2004/0233150 A1 * 11/2004 Guttag ....................... G09G 5/10
345/87

(Continued)

OTHER PUBLICATIONS

Saen et al., 3D System Integration of Processor and Multi-Stacked SRAMs Using Inductive-Coupling Link, 2010 IEEE (Year: 2010).*

*Primary Examiner* — Sung Il Cho

(57) ABSTRACT

A circuit for recycling energy in bit lines (BL and $B_{LB}$) of SRAM during write operation by (i) storing the charges BL and $B_{LB}$ to an intermediate voltage source ($V_{LB}$) in a discharge phase and (ii) restoring the charges from the intermediate voltage, back to the BL or $BL_B$ in a recovery phase. The circuit includes an inductor, a pair of NMOS transistors, a series resonance node, and an energy source ($V_{LB}$) in addition to the components of an SRAM input-output circuit shown as in FIG. 1. During the SRAM write operation, the BL or $BL_B$ is discharged to the energy source $V_{LB}$ through the pair of NMOS transistors and, the inductor and the series resonance node. The remaining energy in the BL and the $BL_B$ is discharged to ground using the write complementary write drivers.

13 Claims, 7 Drawing Sheets

(58) Field of Classification Search
USPC .......................................................... 365/154
See application file for complete search history.

(56) References Cited

U.S. PATENT DOCUMENTS

| | | | | |
|---|---|---|---|---|
| 2006/0034132 A1* | 2/2006 | Jain | ........................ | G11C 7/106 |
| | | | | 365/189.05 |
| 2014/0052961 A1* | 2/2014 | Vorbach | ................... | G06F 9/345 |
| | | | | 712/33 |
| 2021/0241820 A1* | 8/2021 | Biswas | ................ | G06N 3/0635 |
| 2021/0343330 A1* | 11/2021 | Jung | ................... | G11C 11/4096 |

* cited by examiner

SYSTEM AND METHOD FOR RECYCLING ENERGY OF STATIC RANDOM-ACCESS MEMORY (SRAM) WRITE CIRCUIT

BACKGROUND

Technical Field

The embodiments herein generally relate to an energy recycling in System On Chip (SOC), and more particularly, to a system and method for recycling the energy of a Static Random Access Memory (SRAM) circuit of the SOC during multi-voltage level SRAM write operations using magnetic fields.

Description of the Related Art

Modern electronic devices such as a notebook computer comprise a variety of memories to store information. Memory circuits include two major categories. One of such categories is volatile memories and the other is non-volatile memories. The volatile memories include random access memory (RAM), which can be further divided into two sub-categories, a static random access memory (SRAM) and a dynamic random access memory (DRAM). Both SRAM and DRAM are volatile because they may lose information that they store when they are not powered. On the other hand, the non-volatile memories can keep data stored on them.

A typical static random access memory (SRAM) cell includes an array of individual SRAM cells. Each SRAM cell is capable of storing a binary value therein, which value represents a logical data bit logic '1' or a logic '0'. SRAM cells may include different numbers of transistors. According to the total number of transistors in the SRAM cell, the SRAM cell may be referred to as a six-transistor (6-T) SRAM, an eight-transistor (8-T) SRAM, and the like. The SRAM cells are arranged in rows and columns. The SRAM cell is selected during either a READ operation or a WRITE operation by selecting its row and column. The row and column to be selected are determined by a binary code. For example, a 64 Kb (64K Words, each word of N-bit) memory chip comprises a 16-bit binary code (address input) used to select a respective word for READ and WRITE operation.

Each column of SRAM Array is connected to both a bit-line (BL) and the inverse of BL ($BL_B$). The SRAM cell is used to store a single bit. Both BL and $BL_B$ are used to control the operation of reading a bit from or writing a bit into the SRAM cell.

An SRAM write cycle begins by applying the data bits to be written on the data bus (Din). If a user wishes to write logic '0', the user would apply a logic' 0 to the Din which in turn the IO circuit places onto bit lines, i.e. setting Bit Line (BL) to '0' and Bit Line bar ($BL_B$) to '1'. A logic 1 is written by placing logic 1 to Din and inverting BL and $BL_B$.

FIG. 1 illustrates an exemplary commercial SRAM circuit diagram to perform a write operation (PRIOR ART). The SRAM input-output circuit 102 is connected with a pair of bit lines that include a Bit Line (BL) 104A and a Bit Line bar ($BL_B$) 104B. The SRAM input-output circuit 102 includes a pre-charge circuit 106, a set of Multiplexer (MUX) NMOS transistors 108A and 108B, complimentary write drivers 110A, 110B, 110C and 110C-D, a global control unit 112, a Bit Line Pre-Charge (BLPC) signal 114, a Multiplexer selection (MUXSEL) signal 116, a Write Clock (WRCL) signal 118, a latch 124 and inputs 120A and 120B (D and $D_B$) that is driven by Din 126A.

During the write operation of the SRAM, the BL 104A or the $BL_B$ 104B (high capacitive load) is discharged to logic '0' through a ground node 130 based on Din polarity. The MUX NMOS transistors 108A and 108B are connected between the pair of bit lines (i.e. BL 104A and $BL_B$ 104B) and the complimentary write drivers 110A, 110B, 110C and 110D. The complementary write drivers 110A, 110B, 110C and 110D are operated based on the inputs D 120A and the $D_B$ 120B that are received from the latch 124. The inputs D 120A and $D_B$ 120B may be generated by latching the data input Din 126. The inputs D 120A and $D_B$ 120B are provided to the SRAM input-output circuit 102 to operate the complimentary write drivers 110A, 110B, 110C and 110D. The pre-charge circuit 106 is connected to the bit lines BL 104A and $BL_B$ 104B that pre-charge the BL 104A and the $BL_B$ 104B back to supply voltage level (i.e. $V_{DD}$) after the write operation. Pre-charging the number of bit lines back to $V_{DD}$ may consume an immense amount of dynamic power in SRAM.

The SRAM input-output circuit 102 is electrically connected with the global control unit 112 for obtaining timing control signals. The global control unit 112 includes a logic circuitry and output buffers to drive the timing control signals to a number of SRAM input-output circuits of the SRAM. The SRAM may include more than one SRAM input-output circuits. The global control unit 112 provides the timing control signals to the SRAM input-output circuit 102 for performing the write operation. The timing control signals may include the Bit Line Pre-Charge (BLPC) signal 114, the Multiplexer selection (MUXSEL) signal 116 and the Write Clock (WRCL) signal 118. The BLPC signal 114 may carry timing information to the pre-charge circuit 106 for pre-charging the BL 104A or the $BL_B$ 104B to a $V_{DD}$ voltage level. The MUXSEL signal 116 may carry an address decoded signal to turn ON the set of MUX NMOS transistors 108A and 108B. The WRCL signal 118 may serve as a latch clock and gating clock for the inputs D 120A and $D_B$ 120B to provide the timing information of write enable to the complementary write drivers 110A, 110B, 110C and 110D. The timing information is carried by the WRCL signal 118 that reaches the complimentary write drivers 110A, 110B, 110C and 110D through the inputs D 120A and $D_B$ 120B.

During the write operation, the energy of BL 104A or the $BL_B$ 104B is discharged to the ground through (i) the MUX NMOS transistor 108A and 108B and (ii) the complementary write drivers 110A, 110B, 110C and 110D. At the end of the SRAM write operation, the pre-charge circuit 106 is charged back the BL 104A and the $BL_B$ 104B to the supply voltage ($V_{DD}$) for the next operation. The pre-charge circuit 106 consumes significant energy from the SRAM supply voltage ($V_{DD}$) to charge the BL 104A and the $BL_B$ 104B at the end of the SRAM write operation for the next operation. One of the major power-consuming elements in SOC is SRAM because, during the write operation, each SRAM input-output circuit 102 consumes dynamic significant dynamic power as all the bit lines with high capacitive load discharges during the write operation and charges back to $V_{DD}$ through the pre-charge circuit 106.

One of the major power-consuming elements in SRAM is the write operation as all the bit lines with high capacitive load discharges during a write operation and need to be charged back in the recovery phase. Accordingly, there remains a need for a circuit and method for effectively recycling the energy of SRAM input-output circuits during SRAM write operation.

SUMMARY

Embodiments herein provide a circuit for recycling energy of a Static Random Access Memory (SRAM) circuit of a System-on-Chip (SOC) during multi-voltage level SRAM operations using magnetic fields. The circuit includes a pair of bit lines, a pre-charge circuit, MUX NMOS transistors, complementary write drivers, a global control unit, a local control unit, a pair of NMOS transistors and an inductor. The pair of bit lines includes a Bit Line (BL) and a Bit Line bar (BLB). The pre-charge circuit is connected to the pair of bit lines and to pre-charge the pair of bit lines and to a supply voltage level ($V_{DD}$). The MUX NMOS transistors and that are connected with the pair of bit lines. The complementary write drivers are connected with the pair of bit lines and through the MUX NMOS transistors. The global control unit provides control signals with determined timing signals to discharge and charge the energy at the pair of bit lines. The local control unit generates timing sequence control signals for charging and discharging the pair of bit lines in a determined timing sequence. The pair of NMOS transistors are connected with the complementary write drivers, the MUX NMOS transistors and a series resonance node through a VL node to provide a path when the energy discharge from and chargeback to the pair of bit lines and during the SRAM operation. The inductor is connected between the series resonance node and an energy source ($V_{LB}$). The Bit Line (BL) and the Bit Line bar (BLB) are charge or discharge based on a data input (Din) when SRAM operation. The complementary write drivers and the MUX NMOS transistors act as paths to discharge the pair of bit lines to a ground level ('0') using a ground. Along with the pair of NMOS transistors and the complementary write driver, the inductor, the series resonance node and the energy source ($V_{LB}$) forms a series resonance circuit to discharge the energy from the pair of bit lines. The pair of bit lines are discharged to the energy source $V_{LB}$ through the pair of NMOS transistors, the inductor, and the series resonance node during the SRAM operation.

In some embodiments, the energy of the pair of bit lines is discharged in a discharge phase. The discharge phase includes a first phase and a second phase. In the first phase, the energy from the pair of bit lines are discharged, at the energy source $V_{LB}$, less than the supply voltage ($V_{DD}$) and greater than the ground ('0') through at least one of the MUX NMOS transistors, the pair of NMOS transistors, the complementary write drivers or the series resonance node. In the second phase, the remaining energy in the pair of bit lines is discharged to the ground level through the complementary write drivers.

In some embodiments, the energy of the pair of bit lines chargeback in a recovery phase. In the recovery phase, the pair of bit lines are charged to $V_{DD}$ using the energy source $V_{LB}$ and the pre-charge circuit at the end of the SRAM operation.

In some embodiments, the recovery phase includes a first phase and a second phase. In the first phase, the pair of bit lines are charged to greater than the ground ('0') and less than the $V_{DD}$ using the energy source $V_{LB}$, the inductor and the series resonance node. In the second phase, the pair of bit lines are charged to $V_{DD}$ using the pre-charge circuit. The pre-charge circuit charges the pair of bit lines based on a control signal BLPC that are provided from the global control unit.

In some embodiments, the timing sequence control signals provided from the local control unit include VSRB-D, VSRB-$D_B$, VDN-D and VDN-$D_B$. The local control unit provides the timing sequence control signals using global control signals S, the SD and the WRCL. The local control unit generates signals D and $D_B$ using the global control signals. A MUX SEL signal is communicated to a cloud that generates a WSEL$_B$ signal. The WSEL$_B$ signal is latched to provide a WSEL signal to the MUX NMOS transistors. A discharge timing of the energy in the pair of bit lines is determined using the global control signals S and SD.

In some embodiments, the energy source $V_{LB}$ acts as a charge pool during the write operation of the SRAM that stores the energy greater than ground ('0') and less than the supply voltage ($V_{DD}$). The pair of bit lines discharged to below the $V_{DD}$ and close to the ground and a remaining energy in the pair of bit lines is discharged to the ground using the complementary write drivers.

In some embodiments, a resonance inductor that is connected to each parallelly connected with one or more SRAM circuits. The resonance inductor comprises a lower inductance value and a lower effective ON resistance to achieve a high Q factor. The charging and discharging time of the pair of bit lines in a series resonance circuit is determined by resonance frequency.

In some embodiments, the circuit includes two pairs of PMOS transistors. The PMOS transistor is connected in parallel to the NMOS transistor that enables control of the damping of the circuit to achieve small effective ON resistance for high Q factor. The PMOS transistor receives logic low ('0') at a gate node as the PMOS transistor receives a VSRB-D signal from the local control unit for controlling the damping of the circuit when the NMOS transistor receives a logic high ('1') at a gate node. The PMOS transistor is connected in parallel to the MUX transistor to provide effective ON resistance.

In some embodiments, the PMOS transistor is connected in parallel to the NMOS transistor that enables control of the damping of the circuit to achieve small effective ON resistance for high Q factor. The PMOS transistor receives logic low ('0') at a gate node as the PMOS transistor receives a VSRB-$D_B$ signal from the local control unit for controlling the damping of the circuit when the NMOS transistor receives a logic high ('1') at a gate node.

In some embodiments, the circuit includes a charge pump inductor that is connected between the supply voltage ($V_{DD}$) and a VSRB-D drive and a VSRB-$D_B$. A VSR-D signal goes high and turns on a series resonance path to charge and discharge the energy of the pair of bit lines using the energy source ($V_{LB}$) during the SRAM operation when at least one of the VSRB-D or a VSRB-$D_B$ signal is low based on a polarity of an input (D).

In some embodiments, the complementary write drivers provide the series resonance path to discharge the energy from the pair of bit lines during the SRAM operation when a VDN-D or a VDN-$D_B$ goes high based on the polarity of the input D.

In some embodiments, the VSRB-D signal, the VSRB-$D_B$ signal, the VDN-D signal and the VDN-$D_B$ signal are generated from the local control unit based on the global signals provided from the global control unit.

In another aspect, a method for recycling energy of a Static Random Access Memory (SRAM) circuit of a System-on-Chip (SOC) during multi-voltage level SRAM operations using magnetic fields includes (i) charring a pair of bit lines to a supply voltage level ($V_{DD}$) based on a data input (Din) when SRAM operation, (ii) providing control signals with determined timing signals to discharge and charge the energy at the pair of bit lines, (iii) generating timing sequence control signals for charging and discharging the pair of bit lines in a determined timing sequence and (iv) discharging the pair of bit lines to the energy source $V_{LB}$ based on the data input (Din) through a pair of NMOS transistors, an inductor and a series resonance node during SRAM operation.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
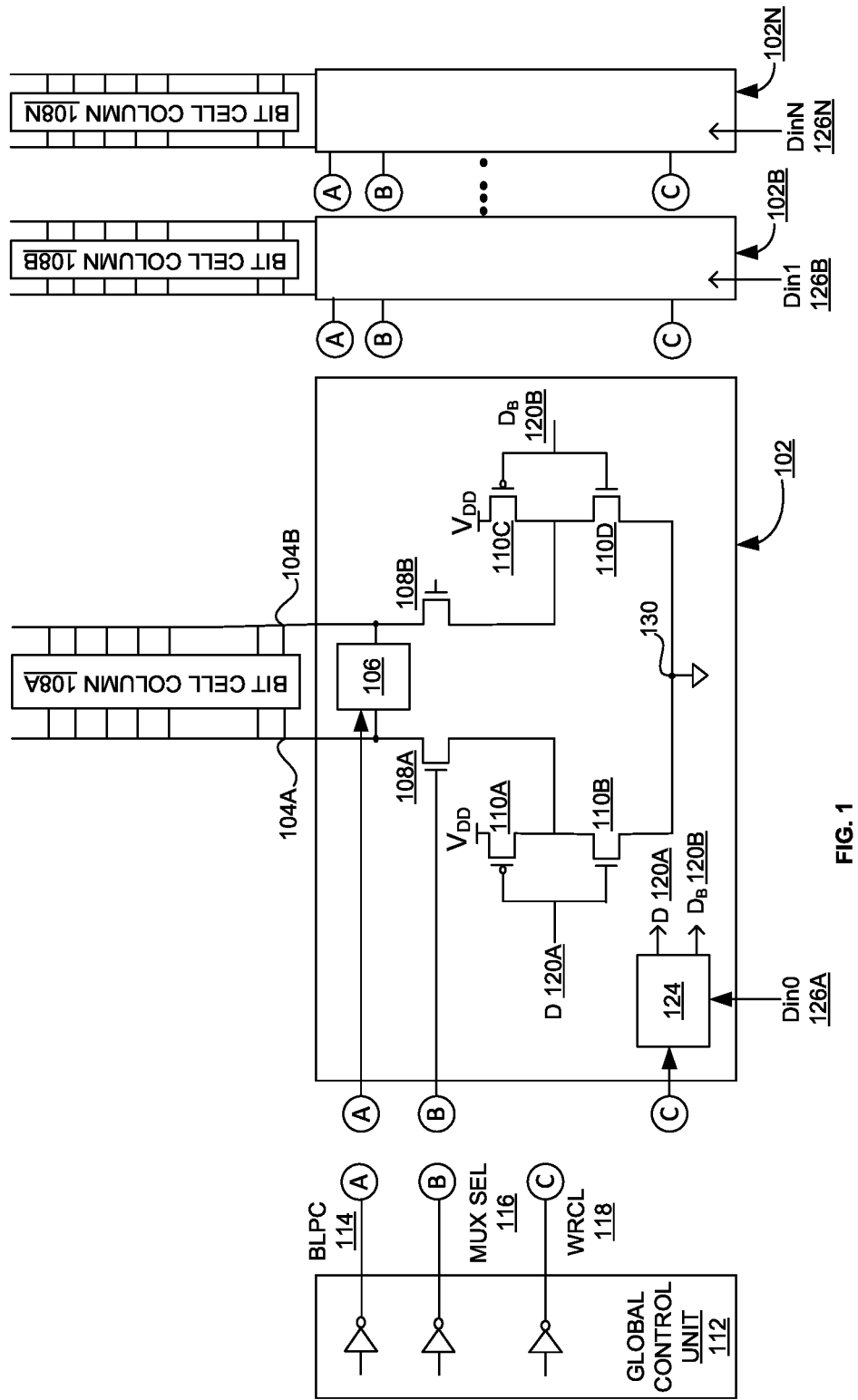
FIG. 1 illustrates an exemplary commercial SRAM circuit diagram to perform a write operation (PRIOR ART)

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a circuit and a method for effectively recycling the energy during SRAM write operation.

The embodiments herein achieve this energy recycling by (i) storing the charges from Bit Line (BL) or Bit Line Bar ($BL_B$) to an intermediate voltage source in a discharge phase and (ii) restoring the charges from the intermediate voltage, back to the BL or $BL_B$ in a recovery phase. Referring now to the drawings, and more particularly to FIG. 2 through FIG. 7, where similar reference characters denote corresponding features consistently throughout the figures, there are shown preferred embodiments.

Definition: The chargeback is that the Bit Line (BL) or Bit Line Bar ($BL_B$) is returned to electric charge ($V_{DD}$) using the energy source $V_{LB}$ and the pre-charge circuit at the end of the SRAM operation.

Figure 2:
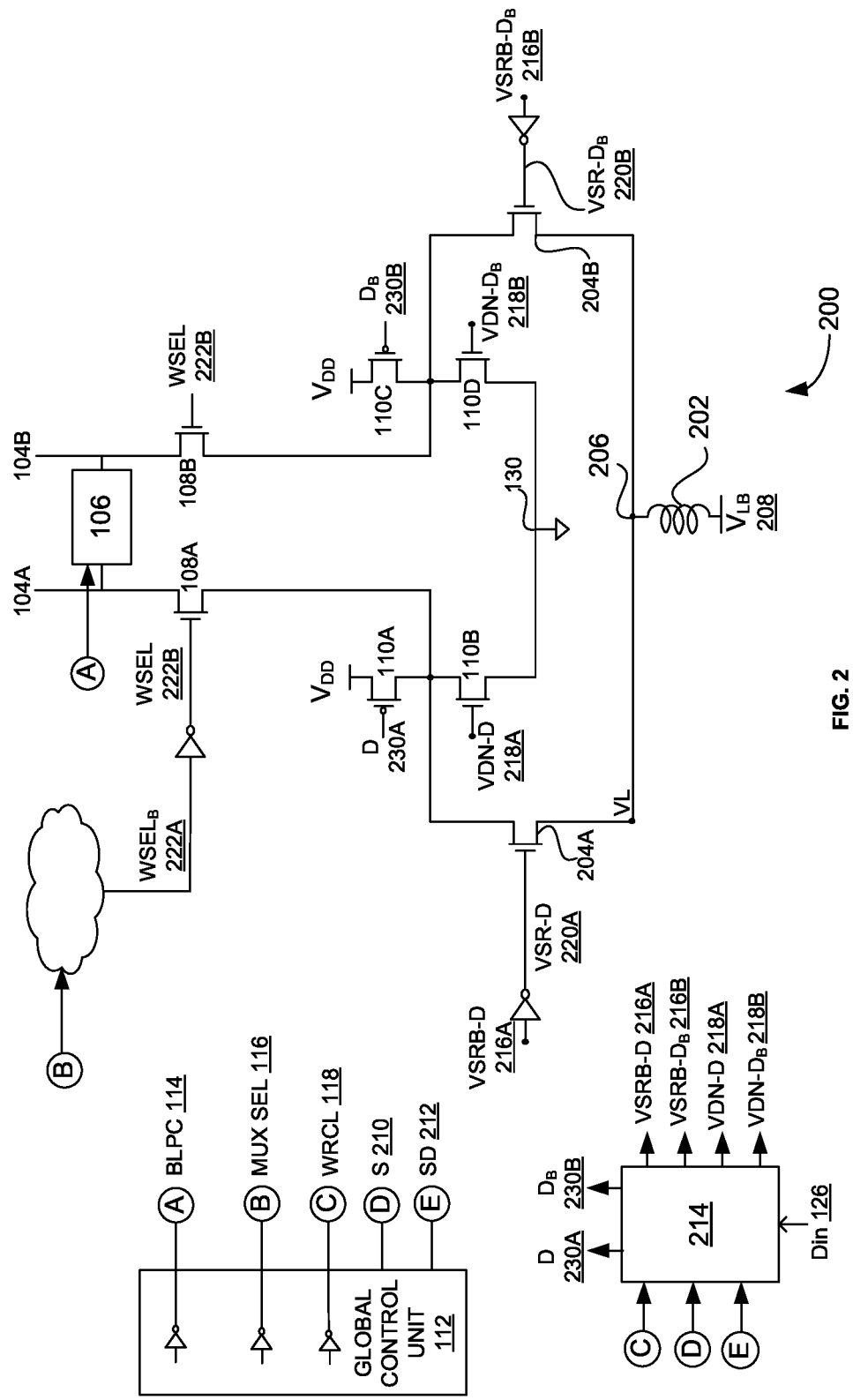
FIG. 2 illustrates a circuit for recycling discharge energy of SRAM input-output circuit of FIG. 1 to reduce power consumption during an SRAM write operation according to some embodiments herein.

FIG. 2 illustrates a circuit 200 for recycling discharge energy of a SRAM input-output circuit 102 (as shown in FIG. 1) to reduce power consumption during an SRAM write operation according to some embodiments herein. The circuit 200 includes an inductor 202, a pair of NMOS transistors 204A and 204B, a series resonance node 206 and an energy source ($V_{LB}$) 208 in addition to the components as shown in the SRAM input-output circuit 102 of FIG. 1. In some embodiments, the circuit 200 is configured in SRAM input-output circuit 102 of FIG. 1. The pair of NMOS transistors 204A and 204B are connected with the complementary write drivers 110A, 110B, 110C and 110D (as shown in FIG. 1) and the series resonance node 206 through a VL node. The inductor 202 is connected between the series resonance node 206 and $V_{LB}$ 208 node. In some embodiments, the pair of NMOS transistors 204A and 204B, the complementary write drivers 110A, 110B, 110C and 110D, the inductor 202, the energy source ($V_{LB}$) 208 form a series resonance circuit to discharge the energy from the BL 104A and $BL_B$ 104B. The energy source ($V_{LB}$) 208 may store energy greater than ground (0) and less than the supply voltage ($V_{DD}$). In some embodiments, the energy source $V_{LB}$ 208 may at half of the supply voltage (i.e. $V_{DD}/2$). In some embodiments, the pair of NMOS transistors 204A and 204B are LVT transistors that may provide a path along with the complementary write drivers 110A, 110B, 110C and 110D and the MUX NMOS transistors 108A and 108B when the energy discharge from and chargeback to BL 104A and $BL_B$ 104B during SRAM write operation. In some embodiments, the inductor 202, the pair of NMOS transistors 204A and 204B, the series resonance node 206 and the energy source $V_{LB}$ 208 provide a series resonance path for charging and discharging the energy from the BL 104A and $BL_B$ 104B during the SRAM write operation.

During the SRAM write operation, the BL 104A or $BL_B$ 104B is discharged to the energy source $V_{LB}$ 208 through the pair of NMOS transistors 204A and 204B, the inductor 202 and the series resonance node 206. In some embodiments, the energy from BL 104A and 104B are discharged to below the $V_{DD}$ and close to the ground, e.g. $V_{DD}/2$. In some embodiments, remaining energy in the BL 104A and the $BL_B$ 104B is discharged to the ground using the complementary write drivers 110B and 110C. In some embodiments, the energy source $V_{LB}$ 208 acts as a charge pool during the write operation of the SRAM.

The global control unit 112 provides control signals with determined timing signals to discharge and charge the energy at BL 104A and 104B. In some embodiments, the energy is discharged in a discharge phase and chargeback in a recovery phase. In another embodiment, the discharge phase includes two phases, in the first phase, the energy from the BL 104A and BL$_B$ 104B is discharged, at the energy source V$_{LB}$ 208, less than the supply voltage (V$_{DD}$) and greater than the ground (0) through at least one of the MUX NMOS transistors 108A and 108B, the pair of NMOS transistors 204A and 204B, the complementary write drivers 110A, 110B, 110C and 110D or the series resonance node 206. In the second phase, the remaining energy in the BL 104A and the BL$_B$ 104B is discharged to the ground through the complementary write drivers 110B and 110C. In some embodiments, the write operation of the SRAM is completed when the energy of the BL 104A and BL$_B$ 104B is fully discharged. The discharge timing of the energy in the BL 104A and the BL$_B$ 104B is determined using control signals S 210 and SD 212. The BL 104A and the BL$_B$ 104B discharge full energy in the discharge phase and charges back in the recovery phase during the SRAM write operation. In the recovery phase, the BL 104A and the BL$_B$ 104B are charged to V$_{DD}$ using the energy source V$_{LB}$ 208 and the pre-charge circuit 106 at the end of the SRAM write operation. In some embodiments, the recovery phase also includes two phases, in the first phase, the BL 104A and BL$_B$ 104B are charged to greater than the ground (0) and less than the V$_{DD}$ (i.e. V$_{DD}$/2) using the V$_{LB}$ 208, the inductor 202 and the series resonance node 206. In the second phase, the BL 104A and the BL$_B$ 104B are charged to V$_{DD}$ using the pre-charge circuit 106. In some embodiments, the pre-charge circuit 106 charges the BL 104A and the BL$_B$ 104B based on the control signal BLPC 114 that is provided from the global control unit 112.

The circuit 200 is electrically connected to a local control unit 214 that generates timing sequence control signals for charging and discharging the BL 104A and BL$_B$ 104B in a determined timing sequence. The timing sequence control signals include VSRB-D 216A, VSRB-D$_B$ 216B, VDN-D 218A and VDN-D$_B$ 218B. The local control unit 214 provides the timing sequence control signals using the control signals S 210, the SD 212 and the WRCL 118. In some embodiments, the control signals S 210, the SD 212 and WRCL 118 are global control signals. The local control unit 214 generates signals D 230A and D$_B$ 230B using the global control signals. In some embodiments, the MUX SEL signal 116 is communicated to a cloud that generates a WSEL$_B$ signal 222A. The WSEL$_B$ signal 222A is latched to provide the WSEL signal 222B to the MUX NMOS transistors 108A and 108B.

In some embodiments, the energy source V$_{LB}$ 208 is determined to store the intermediate voltage, e.g. V$_{DD}$>V$_{LB}$>ground. In another embodiment, the inductor 202 facilitates a higher amount of energy, hence a higher amount of energy is stored using the series resonance circuit. In some embodiments, without the resonance energy recovery architecture shown in FIG. 2, the pre-charge circuit may charge the BL 104A and the BL$_B$ 104B from the ground and to the V$_{DD}$ which causes a higher energy consumption from the supply source.

Figure 3:
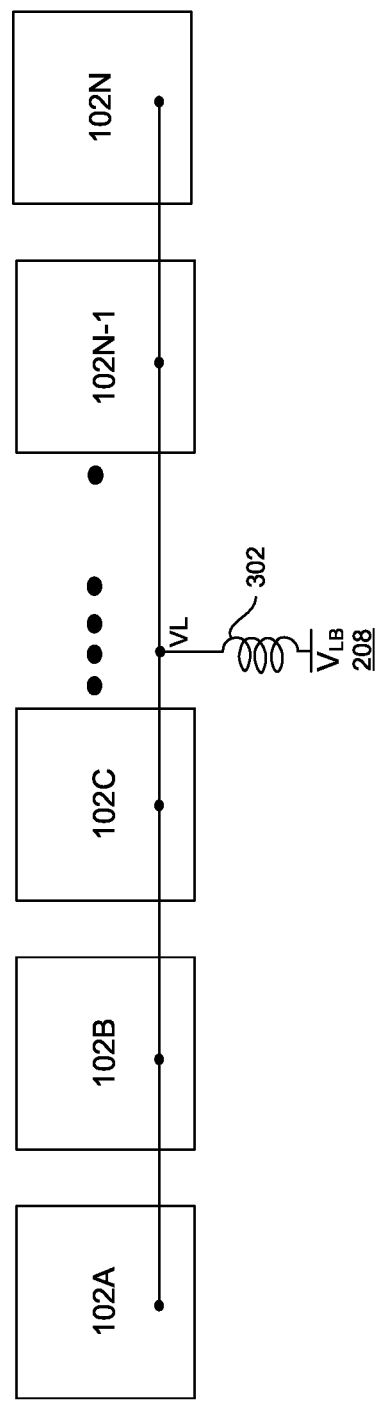
FIG. 3 illustrates an exemplary circuit implementation for recycling discharge energy of the SRAM input-output circuits to reduce power consumption during the SRAM write operation according to some embodiments herein.

With reference to FIG. 2, FIG. 3 illustrates an exemplary circuit implementation for recycling discharge energy of the SRAM input-output circuits to reduce power consumption during the SRAM write operation according to some embodiments herein. The circuit 200 includes a resonance inductor 302 that is connected to each parallelly connected SRAM input-output circuits. The resonance inductor 302 includes lower inductance value and effective ON resistance to achieve a high Q factor. In some embodiments, the high operating frequency provides a high Q factor. The High capacitance load of the BL 108A and the BL$_B$ 108B requires lower inductance value to achieve higher operating frequency. In some embodiments, the charging and discharging time of the series resonance circuit is determined by resonance frequency (Fres), e.g.

$$Fres = \frac{1}{2\pi\sqrt{LC}}.$$

Figure 4:
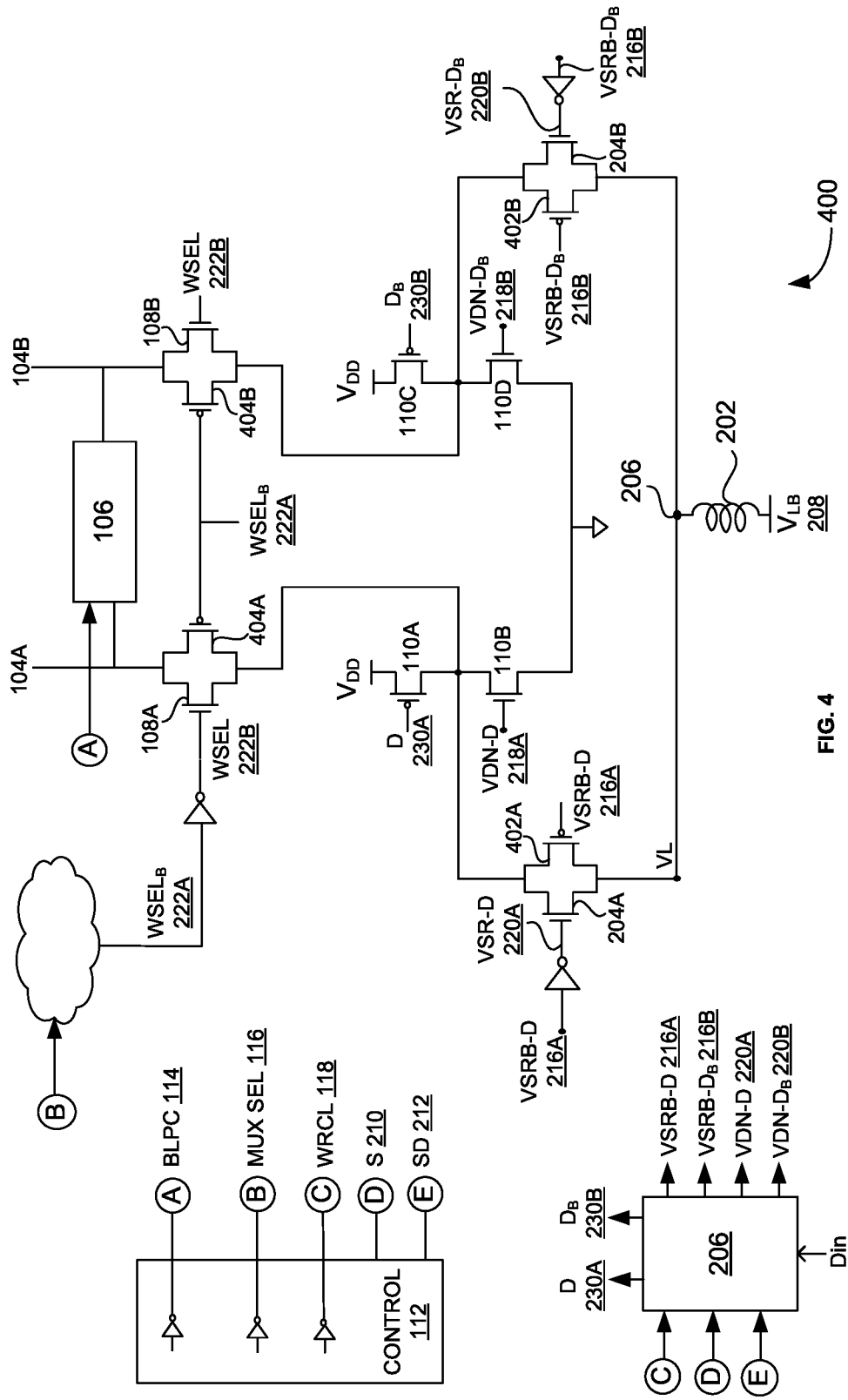
FIG. 4 illustrates an alternative circuit configuration to achieve a high Q factor by reducing series resistance of a series resonant path of the SRAM input-output circuit of FIG. 2 during the SRAM write operation according to some embodiments herein.

FIG. 4 illustrates an alternative circuit configuration 400 to achieve a high Q factor by reducing series resistance of a series resonant path of the SRAM input-output circuit of FIG. 2 during the SRAM write operation according to some embodiments herein. The alternative circuit configuration 400 includes two pairs of PMOS transistors 402A, 402B and 404A, 404B in addition to the components of the circuit 200 shown in FIG. 2. In the discharge phase of the SRAM write operation, the NMOS transistor 204A includes a voltage of V$_{DD}$ in a drain node of the NMOS transistor 204A. The source node NMOS transistors 204A includes a voltage of V$_{LB}$ 208 which causes the damping effective. The PMOS transistor 402A is connected in parallel to the NMOS transistor 204A that enables control of the damping of the circuit 200 to achieve small effective ON resistance for high Q factor. When the NMOS transistor 204A receives a logic high that is '1' at a gate node, the PMOS transistor 402A receives logic low that is '0' at a gate node because of the VSRB-D signal 216A provided to the PMOS transistor 402A from the local control unit 214 for controlling the damping of the circuit 200. In some embodiments, the source-drain potential of the PMOS transistor 402A is the same as the NMOS transistors 204A. In some embodiments, the PMOS transistor 404A and 404B are connected in parallel to the MUX transistor 108A and 108B to achieve small effective ON resistance. In some embodiments, the PMOS transistor 402B is connected in parallel with the NMOS transistor 204B to perform a similar function for controlling the damping of the circuit 200.

Figure 5:
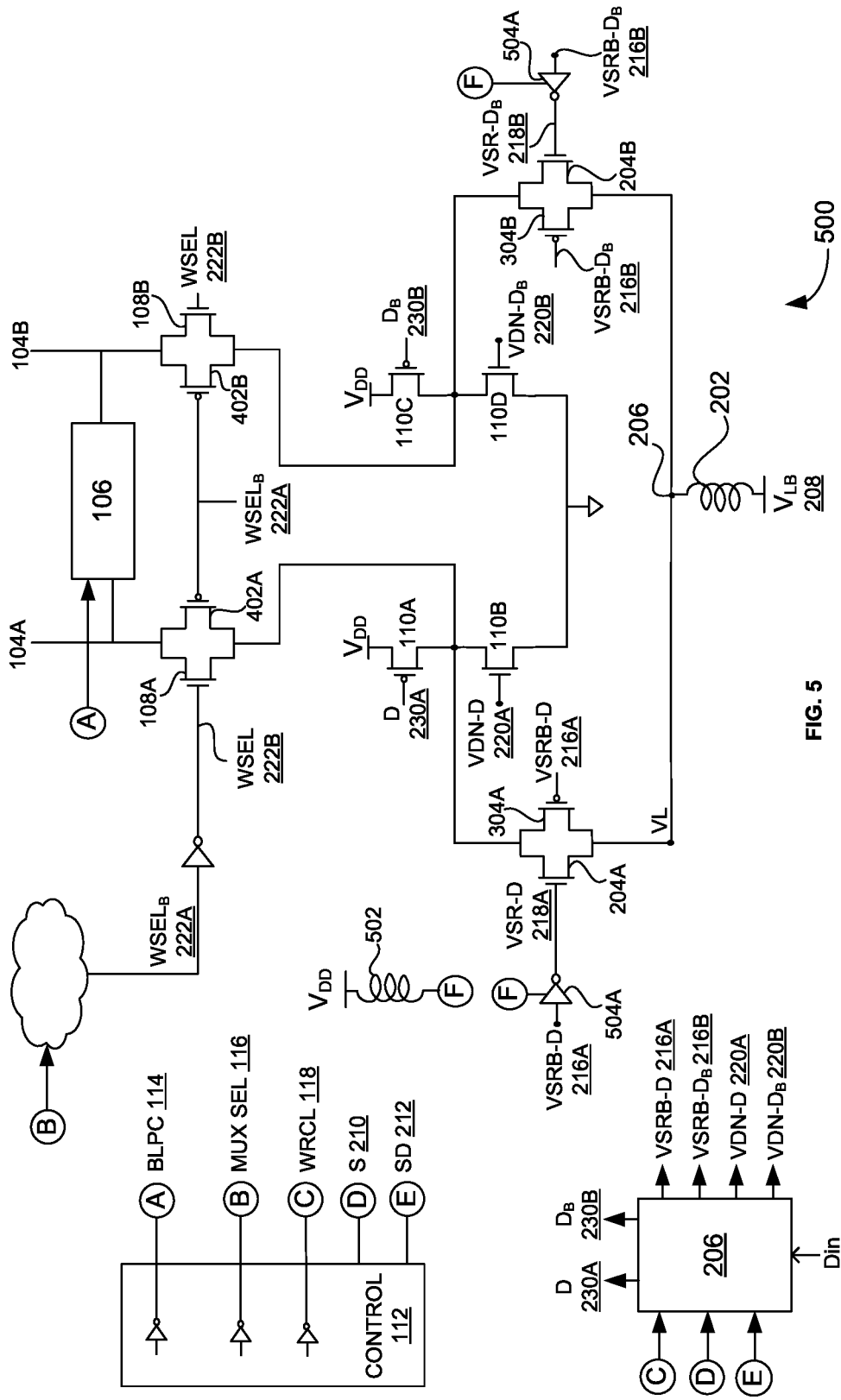
FIG. 5 illustrates an alternative circuit configuration to achieve the high Q factor by increasing overdrive voltage to NMOS transistors in the series resonant path of the SRAM input-output circuit of FIG. 2 according to some embodiments herein.

FIG. 5 illustrates an alternative circuit configuration 500 to achieve the high Q factor by increasing overdrive voltage to NMOS transistors in a series resonant path of the SRAM input-output circuit of FIG. 2 according to some embodiments herein. The alternative circuit configuration 500 includes a charge pump inductor 502 that is connected between the supply voltage (V$_{DD}$) and a VSRB-D drive 504A and a VSRB-D$_B$ 504B in addition of components of the circuit 400 shown in FIG. 4. When either VSRB-D 216A or VSRB-D$_B$ 216B signal is low based on a polarity of the input D 230A, the VSR-D 218A signal goes high and turns on the series resonance path to charge and discharge the energy of the BL 104A and the BL$_B$104B using V$_{LB}$ 208 during the SRAM write operation. In some embodiments, the series resonance path is provided by at least one of the pair of NMOS transistor 204A and 204B, the complementary write drivers 110A, 110B, 110C and 110D, the series resonance node 206. When the VDN-D 220A or VDN-D$_B$ 220B goes high based on the polarity of the input D 230A, then the complementary write drivers 110B or 110D provides a path to discharge the energy from BL 104A and BL$_B$ 104B during the SRAM write operation. In some embodiments, the VSRB-D signal 216A, the VSRB-D$_B$ signal 216B, the VDN-D signal 220A and the VDN-D$_B$ signal 220B are generated from the local control unit 214 based on the global signals provided from the global control unit 214.

Figure 6:
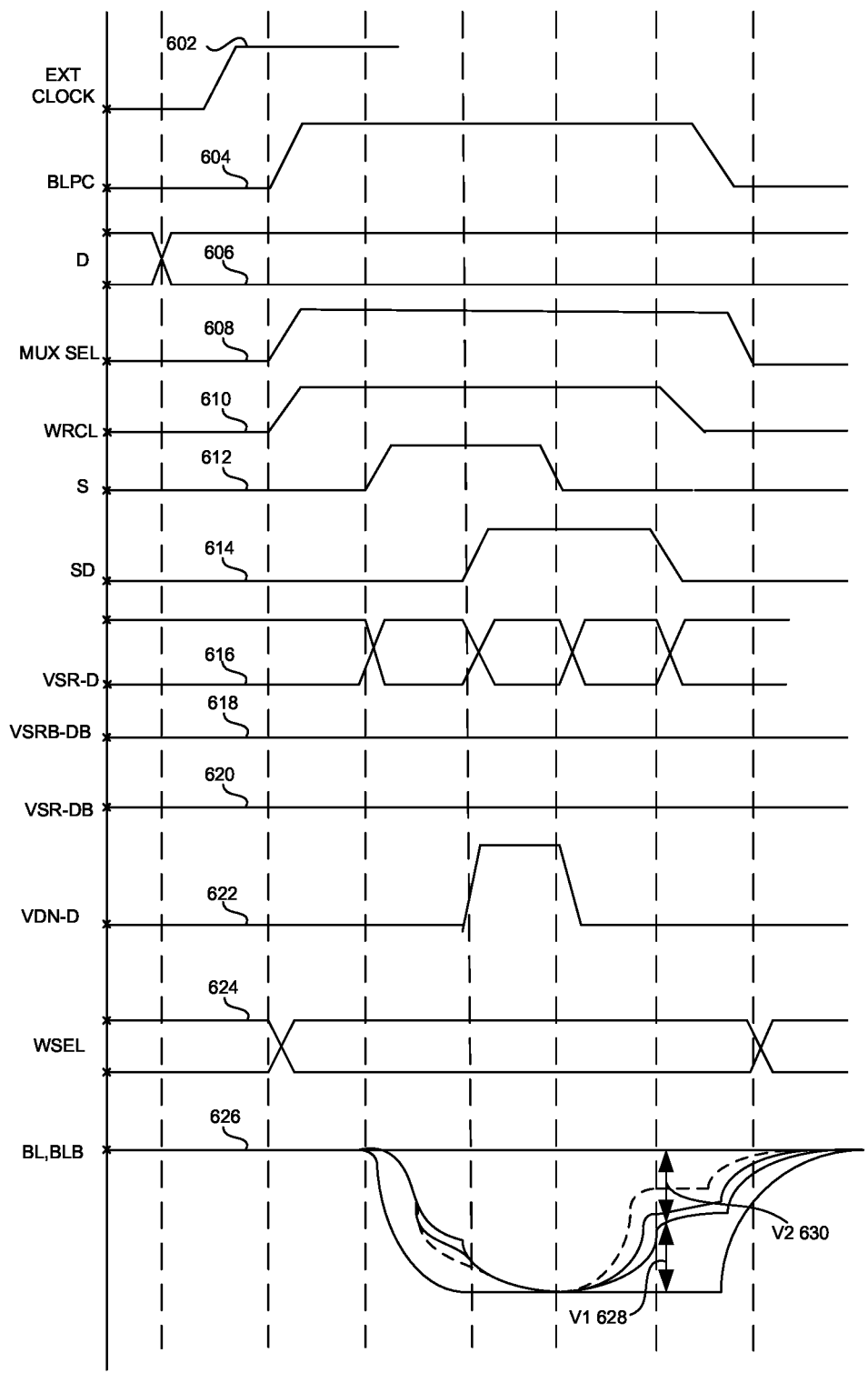
FIG. 6 represents waveforms related to the SRAM input-output circuit of FIG. 2 to FIG. 5 for recycling discharge energy of SRAM input-output circuits to reduce power consumption during the SRAM write operation according to some embodiments herein.

FIG. 6 represents waveforms related to the SRAM input-output circuit of FIG. 2 through FIG. 5 for recycling discharge energy of SRAM input-output circuits to reduce power consumption during the SRAM write operation according to some embodiments herein. A set of waveforms, as depicted in FIG. 6, shows the scenario where the energy discharged in a discharge phase from the BL 104A and the $BL_B$ 104B and stored to the $V_{LB}$ 208 and chargeback the BL 104A and the $BL_B$ 104B from the $V_{LB}$ 208 in a recovery phase. The set of waveforms shown in the graph includes at least one of external clock 602, BLPC 604, D 608, MUX SEL 610, WRCL 612, S 614, SD 616, VSR-D 618, VSR-$D_B$ 620, VDN-D 622, WSEL 624 or Bit lines (BL and BLB) 626 that are involved in the energy discharging and charging of the BL104A and the $BL_B$ 104B as described in FIG. 2, FIG. 3, and FIG. 4. A region V1 628 is an amount of charging of the BL 104A and the $BL_B$ 104B using the stored energy in the $V_{LB}$ 208 and a region V2 630 is an amount of charging of the BL 104A and $BL_B$ 104B using the supply voltage $V_{DD}$ using the pre-charge circuit 106.

Figure 7:
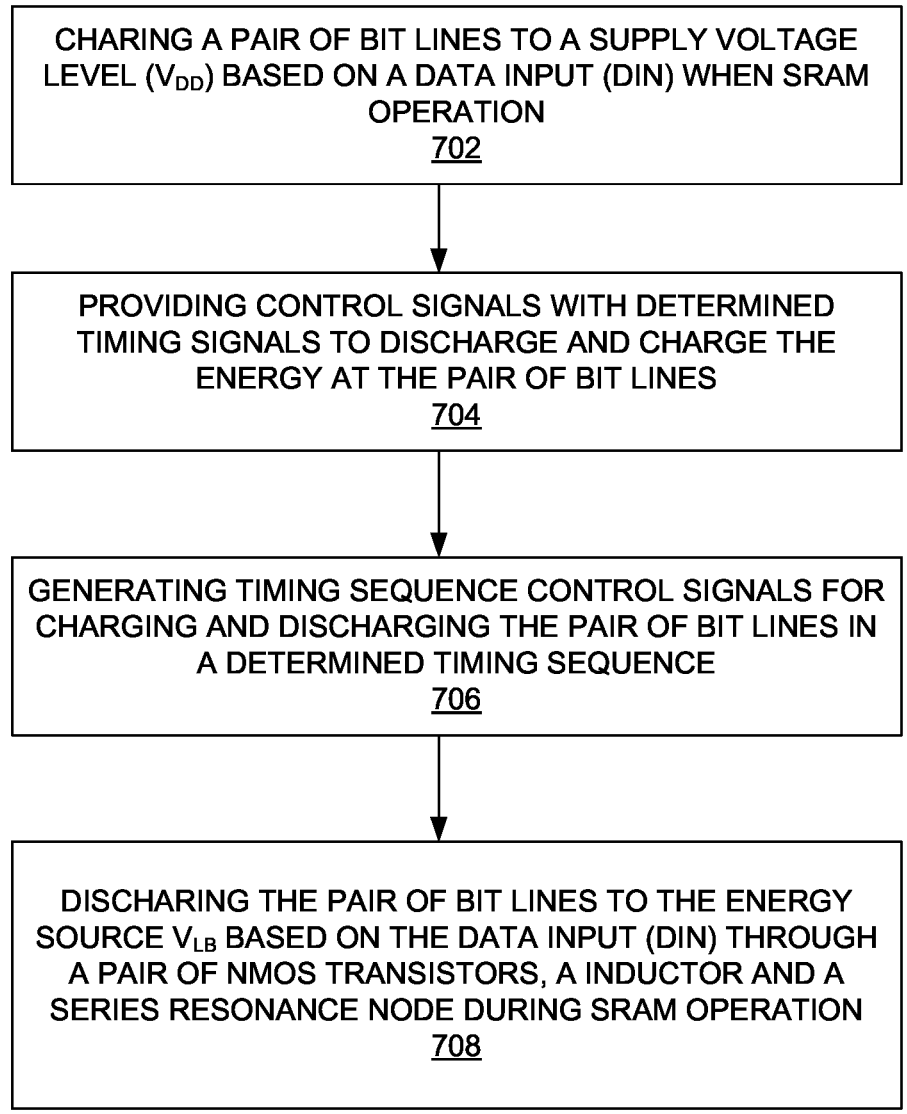
FIG. 7 illustrates a method for recycling discharge energy of SRAM input-output circuit to reduce power consumption during an SRAM write operation according to some embodiments herein.

With reference to FIG. 2, FIG. 7 illustrates a method for recycling discharge energy of SRAM input-output circuit to reduce power consumption during an SRAM write operation according to some embodiments herein. At step 702, the pair of bit lines 104A and 104B is charged to a supply voltage level ($V_{DD}$) based on a data input (Din) when SRAM operation. At step 704, control signals are provided with determined timing signals to discharge and charge the energy at the pair of bit lines 104A and 104B. At step 706, timing sequence control signals are generated for charging and discharging the pair of bit lines 104A and 104B in a determined timing sequence. At step 708, the pair of bit lines 104A and 104B is discharged to the energy source $V_{LB}$ 208 based on the data input (Din) through a pair of NMOS transistors 204A and 204B, an inductor 202 and a series resonance node 206 during SRAM operation.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the specification.

What is claimed is:

1. A circuit for recycling energy of a Static Random Access Memory (SRAM) circuit of a System-on-Chip (SOC) during multi-voltage level SRAM operations using magnetic fields, wherein the circuit comprises:
   a pair of bit lines that includes a Bit Line (BL) and a Bit Line bar (BLB), wherein the Bit Line (BL) and the Bit Line bar (BLB) are charge or discharge based on a data input (Din) when SRAM operation;
   a pre-charge circuit that is connected to the pair of bit lines and to pre-charge the pair of bit lines to a supply voltage level ($V_{DD}$);
   MUX NMOS transistors that are connected with the pair of bit lines;
   complementary write drivers that are connected with the pair of bit lines through the MUX NMOS transistors, wherein the complementary write drivers and the MUX NMOS transistors acts as a path to discharge the pair of bit lines to a ground level ('0') using a ground;
   a global control unit that provides control signals with determined timing signals to discharge and charge the energy at the pair of bit lines;
   characterized in that,
   a local control unit that generates timing sequence control signals for charging and discharging the pair of bit lines in a determined timing sequence;
   a pair of NMOS transistors that are connected with the complementary write drivers, the MUX NMOS transistors and a series resonance node through a VL node to provide a path when the energy discharge from and chargeback to the pair of bit lines during the SRAM operation;
   an inductor that is connected between the series resonance node and an energy source ($V_{LB}$), wherein, along with the pair of NMOS transistors and the complementary write drivers, the inductor, the series resonance node and the energy source ($V_{LB}$) forms a series resonance circuit to discharge the energy from the pair of bit lines, wherein the pair of bit lines are discharged to the energy source $V_{LB}$ through the pair of NMOS transistors, the inductor and the series resonance node during the SRAM operation.

2. The circuit of claim 1, wherein the energy of the pair of bit lines is discharged in a discharge phase, wherein the discharge phase comprises a first phase and a second phase, wherein in the first phase, the energy from the pair of bit lines are discharged, at the energy source $V_{LB}$, less than the supply voltage ($V_{DD}$) and greater than the ground ('0') through at least one of the MUX NMOS transistors, the pair of NMOS transistors, the complementary write drivers or the series resonance node, wherein in the second phase, the remaining energy in the pair of bit lines is discharged to the ground level through the complementary write drivers.

3. The circuit of claim 1, wherein the energy of the pair of bit lines chargeback in a recovery phase, wherein in the recovery phase, the pair of bit lines are charged to $V_{DD}$ using the energy source $V_{LB}$ and the pre-charge circuit at the end of the SRAM operation.

4. The circuit of claim 3, wherein the recovery phase includes a first phase and a second phase, wherein in the first phase, the pair of bit lines are charged to greater than the ground ('0') and less than the $V_{DD}$ using the energy source $V_{LB}$, the inductor and the series resonance node, wherein in the second phase, the pair of bit lines are charged to $V_{DD}$ using the pre-charge circuit, wherein the pre-charge circuit charges the pair of bit lines based on a control signal BLPC that are provided from the global control unit.

5. The circuit of claim 1, wherein the timing sequence control signals provided from the local control unit include VSRB-D, VSRB-$D_B$, VDN-D and VDN-$D_B$, wherein the local control unit provides the timing sequence control signals using global control signals S, the SD and the WRCL, wherein the local control unit generates signals D and $D_B$ using the global control signals, wherein a MUX SEL signal is communicated to a cloud that generates a $WSEL_B$ signal, wherein the $WSEL_B$ signal is latched to provide a WSEL signal to the MUX NMOS transistors, wherein a discharge timing of the energy in the pair of bit lines is determined using the global control signals S and SD.

6. The circuit of claim 1, wherein the energy source $V_{LB}$ acts as a charge pool during the write operation of the SRAM that stores the energy greater than ground ('0') and less than the supply voltage ($V_{DD}$), wherein the pair of bit lines discharged to below the $V_{DD}$ and close to the ground and a remaining energy in the pair of bit lines is discharged to the ground using the complementary write drivers.

7. The circuit of claim 1, wherein a resonance inductor that is connected to each parallelly connected with one or more SRAM circuits, wherein the resonance inductor includes lower inductance value and effective ON resistance to achieve a high Q factor, wherein the charging and discharging time of the pair of bit lines in a series resonance circuit is determined by resonance frequency.

8. The circuit of claim 1, wherein the circuit comprises two pairs of PMOS transistors, wherein the PMOS transistor is connected in parallel to the NMOS transistor that enables control of the damping of the circuit to achieve small effective ON resistance for high Q factor, wherein the PMOS transistor receives logic low ('0') at a gate node as the PMOS transistor receives a VSRB-D signal from the local control unit for controlling the damping of the circuit when the NMOS transistor receives a logic high ('1') at a gate node, wherein the PMOS transistor and are connected in parallel to the MUX transistor to provide effective ON resistance.

9. The circuit of claim 8, wherein the PMOS transistor is connected in parallel to the NMOS transistor that enables control of the damping of the circuit to achieve small effective ON resistance for high Q factor, wherein the PMOS transistor receives logic low ('0') at a gate node as the PMOS transistor receives a $VSRB-D_B$ signal from the local control unit for controlling the damping of the circuit when the NMOS transistor receives a logic high ('1') at a gate node.

10. The circuit of claim 8, wherein the circuit comprises a charge pump inductor that is connected between the supply voltage ($V_{DD}$) and a VSRB-D drive and a $VSRB-D_B$, wherein a VSR-D signal goes high and turns on a series resonance path to charge and discharge the energy of the pair of bit lines using the energy source ($V_{LB}$) during the SRAM operation when at least one of the VSRB-D or a $VSRB-D_B$ signal is low based on a polarity of an input (D).

11. The circuit of claim 8, wherein the complementary write drivers provides the series resonance path to discharge the energy from the pair of bit lines during the SRAM operation when a VDN-D or a $VDN-D_B$ goes high based on the polarity of the input D.

12. The circuit of claim 11, wherein the VSRB-D signal, the $VSRB-D_B$ signal, the VDN-D signal and the $VDN-D_B$ signal are generated from the local control unit based on the global signals provided from the global control unit.

13. A method for recycling energy of a Static Random Access Memory (SRAM) circuit of a System-on-Chip (SOC) during multi-voltage level SRAM operations using magnetic fields comprising:
  charging or discharging a pair of bit lines that includes a Bit Line (BL) and a Bit Line bar (BLB) based on a data input (Din) when SRAM operation;
  pre-charging, using a pre-charge circuit, the pair of bit lines to a supply voltage level ($V_{DD}$);
  discharging, using complementary write drivers that are connected with the pair of bit lines through the MUX NMOS transistors, the pair of bit lines to a ground level ('0') using a ground;
  providing, using a global control unit, control signals with determined timing signals to discharge and charge the energy at the pair of bit lines;
  generating, using a local control unit, timing sequence control signals for charging and discharging the pair of bit lines in a determined timing sequence;
  providing a path when the energy discharge from and chargeback to the pair of bit lines during the SRAM operation using a pair of NMOS transistors that are connected with the complementary write drivers, the MUX NMOS transistors and a series resonance node through a VL node; and
  discharging, using a series resonance circuit, the pair of bit lines to the energy source $V_{LB}$ based on the data input (Din) through a pair of NMOS transistors, an inductor and the series resonance node during SRAM operation, wherein the inductor is connected between the series resonance node and an energy source ($V_{LB}$), wherein, along with the pair of NMOS transistors and the complementary write drivers, the inductor, the series resonance node and the energy source ($V_{LB}$) forms the series resonance circuit.

* * * * *